United States Patent [19]

Sprengling

[11] 3,931,454
[45] Jan. 6, 1976

[54] PRINTED CIRCUIT BOARD AND METHOD OF PREPARING IT

[75] Inventor: Gerhard R. Sprengling, Blairsville, Pa.

[73] Assignee: Westinghouse Electric Corporation, Pittsburgh, Pa.

[22] Filed: Oct. 17, 1972

[21] Appl. No.: 298,213

[52] U.S. Cl. .................. 174/68.5; 29/588; 29/627; 264/272; 317/101 C; 317/101 CC
[51] Int. Cl.² ...................... H05K 3/28; H05K 1/18
[58] Field of Search ............ 29/626, 627, 588, 575, 29/613, 401; 317/101 R, 101 A, 101 B, 101 C, 101 CP, 101 CC; 264/272; 117/200, 212, 213, 215, 216, 218; 174/68.5

[56] References Cited
UNITED STATES PATENTS

| | | | |
|---|---|---|---|
| 2,877,544 | 3/1959 | Gammel | 264/272 X |
| 3,377,699 | 4/1968 | Dinella et al. | 317/101 CP |
| 3,652,333 | 3/1972 | Warren | 117/218 |
| 3,682,698 | 8/1972 | Palmer et al. | 117/200 |
| 3,693,252 | 9/1972 | Robertson et al. | 29/627 |

OTHER PUBLICATIONS
Licari and Brands, "Organic Coatings," Machine Design, May 25, 1967, pp. 176–194.

*Primary Examiner*—C. W. Lanham
*Assistant Examiner*—Joseph A. Walkowski
*Attorney, Agent, or Firm*—R. D. Fuerle

[57] ABSTRACT

A printed circuit board is prepared by connecting electronic components to the circuit, coating the board with a layer up to about 0.1 mil thick of a compound of the formula $C_nF_{2n+1}C_mX_{2m}\cdot CHY-OOC-C(R)=CH_2$ or its prepolymer, replacing at least one of the electronic components, thermally bonding another electronic component to the circuit, and recoating the area around the new component with a layer of the compound or its prepolymer. In the formula $n$ is 2 to 9, $m$ is 1 to 9, X and Y are H, F Cl, or Br and R is —H or —CH₃. This method enables a printed circuit board to be easily repaired since the coating on the board can be soldered or welded through without first removing the coating or protecting the surrounding coating.

13 Claims, 1 Drawing Figure

U.S. Patent  Jan. 6, 1976  3,931,454
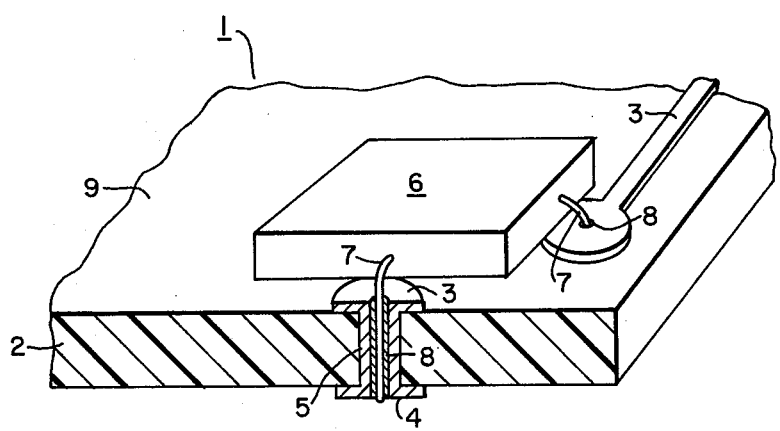

PRINTED CIRCUIT BOARD AND METHOD OF PREPARING IT

BACKGROUND OF THE INVENTION

Printed circuit boards which have electronic components mounted on them are frequently coated with a protective coating (often called a conformal coating) to shield them from contaminants and to preserve their electrical properties when moisture is present. These coatings are most commonly not solderable or weldable. That is, if an electronic component must be replaced the coating must first be removed, typically with a solvent or by mechanical means, and the surrounding coating must be protected with a mask during the soldering or welding operation. If this is not done the surrounding coating will be chemically altered by the heat and may be rendered ineffective. Also, the degradation products formed may attack the printed circuit board or alter its electrical resistance and the coating may mix with the solder to produce a questionable bond. Thus, repairing such a board can be a time-consuming and delicate operation.

RELATED ART

Marianne K. Bernett and W. A. Zisman in a FEB. 14, 1964 U.S. Naval Research Laboratory Report (No. 6039) titled "Hydrophobic and Oleophobic Fluoropolymer Coatings of Extremely Low Surface Energy" tested surface energies of 6 to 9 mil coatings of $C_7F_{15}CH_2OOC - C(CH_3) = CH_2$ on glass-epoxy panels. The coatings were applied by pouring a 20% solution in xylene hexafluoride on the panel and evaporating the solvent. The article suggests that the compounds may be useful as coatings on electronic equipment for protection from humidity.

SUMMARY OF THE INVENTION

I have found that electronic components on printed circuit boards coated with certain fluorine compounds can be easily replaced without first removing or protecting the coating. That is, after the printed circuit board has been coated an electronic component can be simply un-soldered or un-welded and a new component thermally bonded to the circuit. The coating does not prevent solder from wetting and adhering to the circuit even though the coating is highly hydrophobic and oleophobic. The heat does not form products which attack the board or alter its electrical properties.

I have also found that coatings of less than about 0.1 mil in thickness provide the same moisture protection that thicker coatings do, but are easier to thermally bond through since less coating is present to interfere with the transference of heat. Also, less time is required for bonding which reduces the likelihood of the heat damaging the insulating board of the printed circuit board or loosening the circuit.

DESCRIPTION OF THE INVENTION

The accompanying drawing is an isometric view in section of a portion of a certain presently preferred printed circuit board according to this invention.

In the drawing a printed circuit board 1 is composed of an insulating board 2 with conducting circuits 3 and 4 bonded to it on each side. A plated hole 5 in the board 2 connects portions of the two circuits. Electronic component 6, which is a replacement, has leads 7 which are thermally bonded to circuit 3 by solder 8. A coating 9 (too thin to show on drawing) of the fluorine compound of this invention covers the printed circuit board 1 and the electronic component.

Any type of insulating board material can be used which will not be damaged by the thermal bonding operation. Examples include polyethylene, polystyrene, polyphenylene oxide, polypropylene, polysulfone, polyimides, polyamide-imides, etc. The three most widely used materials are phenolics, epoxies, and polyesters. Commonly, the material is reinforced for strength and dimensional stability. For example, glass-reinforced epoxy is a very common insulating board material. The printed circuit board may have almost any shape or dimension, but rectangular boards one inch to one foot in length and width and 10 mils to one-eighth inch in thickness are typical.

A conductor is bonded to one or both sides of the insulating board in a circuit pattern. The conductor is usually copper as it is easy to etch and to solder to, but gold, silver-plated copper, aluminum, stainless steel, or iron-nickel-cobalt alloys, etc. could also be used. A copper conductor is typically 1 to 2 mils thick.

While the printed circuit board may be coated before the electronic components have been mounted to it in order to protect it from moisture, dirt, fingerprints, etc. during storage and handling, usually the electronic components are mounted to the board before it is coated. Electronic components include transistors, resistors, integrated circuit chips, capacitors, thermistors, thyristors, diodes, etc.

The electronic components are mounted on the circuit board by thermally bonding them to the circuit. Thermal bonding includes soldering, welding, ultrasonics, and other methods which bond by heating two contacting surfaces. Soldering is preferred as it is inexpensive and works well on copper.

The fluorine compound as a monomer has the general formula

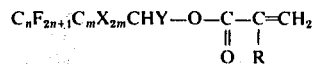

X is preferably all fluorine for the best humidity resistance and solderability properties, but up to about 20% of the X groups may be hydrogen, chlorine, bromine, or mixtures thereof. Y is preferably H as this compound is easiest to make, but it could also be F, Cl, or Br. R is H or $CH_3$, n is an integer from 2 to 9 and m is an integer from 1 to 9. The sum of $m$ and $n$ is preferably 5 to 10 as that interval offers a good balance between scratch resistance and moisture resistance. The R group is preferably $-CH_3$ as that compound is commercially available, works well and leaves less residue when heated to the point of depolymerization. The $C_nF_{2n+1}C_mX_{2m+1}$ chain is preferably linear for best humidity resistance, although it could also be branched.

While the above-described compound itself may be used, it is preferable to use a prepolymer of the compound since the compound itself is somewhat volatile and therefore difficult to keep on the surface of the printed circuit board until it has been polymerized. The prepolymer has the general formula:

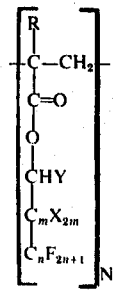

where N, the number of polymeric units, is preferably at least about 3 as smaller polymers are more volatile, and is less than about 100 as larger polymers are not very soluble. The Y, R, m, and n in the formula were previously defined.

The compound or its prepolymer is applied to the printed circuit board in a solution, preferably about a 1 to about a 10% (all percentages herein are by weight) solution as that percentage range provides a thin enough solution to readily cover the board yet it contains a sufficient amount of the compound to provide a coating of adequate thickness. Suitable solvents include tricholoromonofluoromethane (sold as "Freon-11"), xylene hexafluoride, and other similar halogenated solvents, but xylene hexafluoride is preferred as it has consistently worked well. The solution may be applied to the board by brushing, spraying, etc., but dipping is preferred to insure complete coverage. The solvent is then evaporated by, for example, air drying or with heat.

If the compound itself is used or if a prepolymer of less than about 50 polymeric units is used the compound or prepolymer is polymerized to form a prepolymer of at least about 50 polymeric units or otherwise it may be too soft or tend to evaporate. The compound may be polymerized to form a prepolymer by, for example, forming a solution in a suitable solvent such as xylene hexafluoride, of the compound and about ½% of a radical initiator such as azo-bis(isobutyronitrile) or a peroxide, and heating at about 80° to about 150°C for a few hours. The prepolymer may be further polymerized by heating the coating at about 125° to about 175°C for about 15 to about 45 minutes, but this is not preferred if the prepolymer is already a high-melting solid (i.e., melts over about 50°C) and most prepolymers will be high-melting solids if they are over about 50 polymeric units long. Further polymerization is not preferred because it is an added expense which only increases the solvent resistance of the coating, and the solvent resistance is usually adequate as it is.

When one of the electronic components on the board is found to be defective it is thermally "un-bonded" and a new component is thermally bonded in its place. No preparations or precautions for the coating are necessary prior to the un-bonding and "re-bonding" operations.

The following examples further illustrate this invention.

EXAMPLE I

Four glass-reinforced epoxy printed circuit boards 4 × 5 and 1/16 inch thick wereused. The boards had a circuit test pattern in 1 oz. copper (i.e., 1 oz. per ft.²) on both sides. The boards were with chlorethene and copper lead wires were soldered to the six termination points on each board.

The boards were dipped into a 2% xylene hexafluoride solution of a prepolymer sold under the trademark "FC — 706" by the 3M Company, analyzed as a prepolymerized solution of $C_7F_{15}CH_2OOc— C(CH_3) = Ch_2$. The boards were air dried for 20 minutes at room temperature to form coatings less than 0.1 mils thick. The lead wires were unsoldered and new lead wires were then individually soldered to the same position using 60% lead — 40% tin solder. The soldered areas were cleaned with chlorethene to remove solder flux and recoated with the solution and air dried.

No carbonization of the coating surrounding the soldered areas was observed and the surrounding coating appeared unaffected even when viewed under a microscope. The surrounding coating and the new coating both adhered to the board well and provided adequate moisture protection for the board.

EXAMPLE II

The surface resistance at 100% relative humidity of a glass-epoxy board with copper electrodes on one side stressing about four squares of surface was determined using 500 volts across the electrodes. The board was air dried and a coating of FC—706 was brushed on. The coating was air dried then baked 10 minutes at 150°C. The board was placed in 100% relative humidity again and the surface resistance was determined periodically at 500 volts. The following table gives the results:

| Exposure | Surface Resistance (ohms) |
|---|---|
| Before coating | 2.5× 10⁹ |
| 4 days | 2.5× 10¹³ |
| 14 days | 1.0× 10¹³ |
| 21 days | 1.1× 10¹³ |
| 28 days | 8× 10¹² |
| 34 days | 7× 10¹² |
| 41 days | 8× 10¹² |
| 49 days | 4× 10¹² |
| 72 days | 2× 10¹² |

The above table shows the effectiveness of the coating in preventing a decrease in surface resistance in high humidity.

I claim:

1. A method of preparing a printed circuit board composed of an insulating board having a conducting circuit bonded to at least one side comprising:
  1. connecting with solder electronic components to the conducting circuit of the said printed circuit board;
  2. coating the printed circuit board with a layer up to about 0.1 mils thick of a compound selected from the group consisting of monomers of the general formula

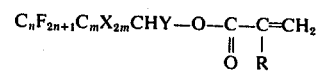

and prepolymers thereof containing up to about 100 polymeric units, where n is an integer from 2 to 9, m is an integer from 1 to 9, R is —H or —CH₃, Y is selected from the group consisting of H, F, Cl, and Br, and 80 to 100% of the X atoms are F and 0 to 20% of the X atoms are selected from the group consisting of H, Cl, Br, and mixtures thereof;
  3. removing at least one of said electronic components by melting said solder without first removing said layer and thermally bonding another electronic component in place thereof; and
  4. recoating said printed circuit board around the area where said other electronic component was bonded with a layer of said compound up to about 0.1 mils thick.

2. A method according to claim 1 wherein said compound is a prepolymer of said monomer having about 50 to 100 polymeric units.

3. A method according to claim 1 wherein said coating is done by applying about a 1 to about a 10% solution of said compound to said printed circuit board and evaporating the solvent of said solution.

4. A method according to claim 3 wherein said solution is applied to said printed circuit board by dipping said printed circuit board into said solution.

5. A method according to claim 3 wherein said solvent is xylene hexafluoride.

6. A method according to claim 1 wherein said conducting circuit is copper and said thermal bonding is done by soldering.

7. A method according to claim 1 wherein the sum of $n$ and $m$ is 5 to 10.

8. A method according to claim 1 wherein R is —$CH_3$.

9. A method according to claim 1 wherein said insulating board is glass-reinforced epoxy.

10. A method according to claim 1 wherein said $C_nF_{2n+1}C_mX_{2m}$ chain is linear.

11. A method according to claim 1 wherein said compound is $C_7F_{15}CH_2OOC - C(CH_3) = CH_2$.

12. A method according to claim 1 wherein said printed circuit board is cleaned in the area where said other electronic component was bonded prior to said recoating to remove solder flux if present.

13. A printed circuit board made according to the method of claim 1.

* * * * *